(12) United States Patent
Ma et al.

(10) Patent No.: US 7,943,990 B2
(45) Date of Patent: May 17, 2011

(54) POWER SEMICONDUCTOR DEVICE WITH INTERCONNECTED GATE TRENCHES

(75) Inventors: Ling Ma, Torrance, CA (US); Adam I. Amali, Hawthorne, CA (US); Russell Turner, South Wales (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/504,751

(22) Filed: Aug. 14, 2006

(65) Prior Publication Data

US 2007/0040215 A1 Feb. 22, 2007

Related U.S. Application Data

(63) Continuation-in-part of application No. 11/338,215, filed on Jan. 24, 2006.

(60) Provisional application No. 60/709,020, filed on Aug. 17, 2005.

(51) Int. Cl.
*H01L 29/66* (2006.01)

(52) U.S. Cl. ............................. 257/330; 257/E29.257

(58) Field of Classification Search .......... 257/213–413, 257/E29.257
See application file for complete search history.

(56) References Cited

U.S. PATENT DOCUMENTS

| | | | |
|---|---|---|---|
| 5,430,315 A | 7/1995 | Rumennik | |
| 6,262,453 B1 | 7/2001 | Hshieh | |
| 6,274,905 B1 * | 8/2001 | Mo | 257/330 |
| 6,291,298 B1 * | 9/2001 | Williams et al. | 438/270 |
| 6,309,929 B1 | 10/2001 | Hsu et al. | |
| 6,337,498 B1 * | 1/2002 | Hasegawa et al. | 257/328 |
| 6,462,376 B1 * | 10/2002 | Wahl et al. | 257/331 |
| 6,580,123 B2 | 6/2003 | Thapar | |
| 6,806,533 B2 * | 10/2004 | Henninger et al. | 257/328 |
| 6,833,583 B2 | 12/2004 | In't Zandt et al. | |
| 6,838,735 B1 | 1/2005 | Kinzer et al. | |
| 7,081,388 B2 | 7/2006 | Jones | |
| 2003/0127702 A1 | 7/2003 | Blair et al. | |
| 2004/0012050 A1 | 1/2004 | Uno | |
| 2004/0137684 A1 | 7/2004 | Ma et al. | |

FOREIGN PATENT DOCUMENTS

| | | |
|---|---|---|
| EP | 1 351 313 | 8/2003 |
| JP | 01192174 | 8/1989 |
| JP | 10-12877 | 1/1998 |
| JP | 10-256545 | 9/1998 |
| JP | 2000-200901 | 7/2000 |
| JP | 2001-168329 | 6/2001 |
| JP | 2004-200540 | 7/2004 |
| JP | 2000-216385 A | 6/2009 |
| WO | WO 00/42665 | 7/2000 |
| WO | WO 01/20684 A1 | 3/2001 |
| WO | WO 03/023861 A2 | 3/2003 |

OTHER PUBLICATIONS

International Search Report dated Apr. 24, 2007 for PCT/US06/32060.
International Search Report dated Feb. 21, 2007 for PCT/US06/02848.
International Search Report issued Apr. 1, 2008 in PCT Application No. PCT/US06/32169.
European Search Report dated Oct. 6, 2008 issued in corresponding EP Application Serial No. 06801678.1.

* cited by examiner

*Primary Examiner* — Bradley K Smith
(74) *Attorney, Agent, or Firm* — Farjami & Farjami LLP

(57) ABSTRACT

A power semiconductor device which includes a plurality of gate trenches and a perimeter trench intersecting the gate trenches.

19 Claims, 9 Drawing Sheets

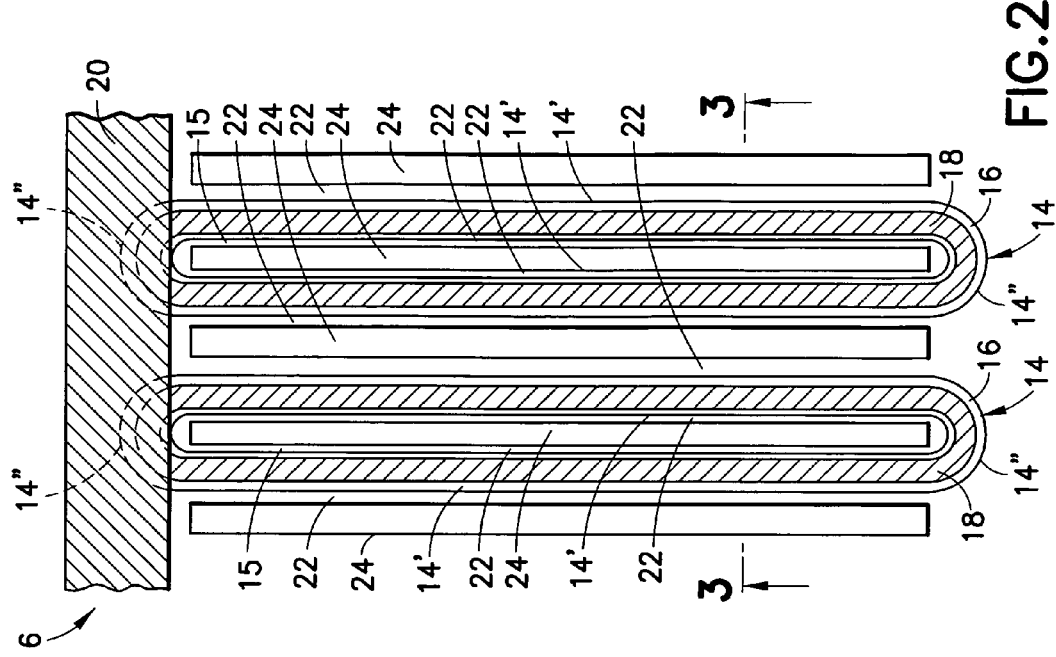
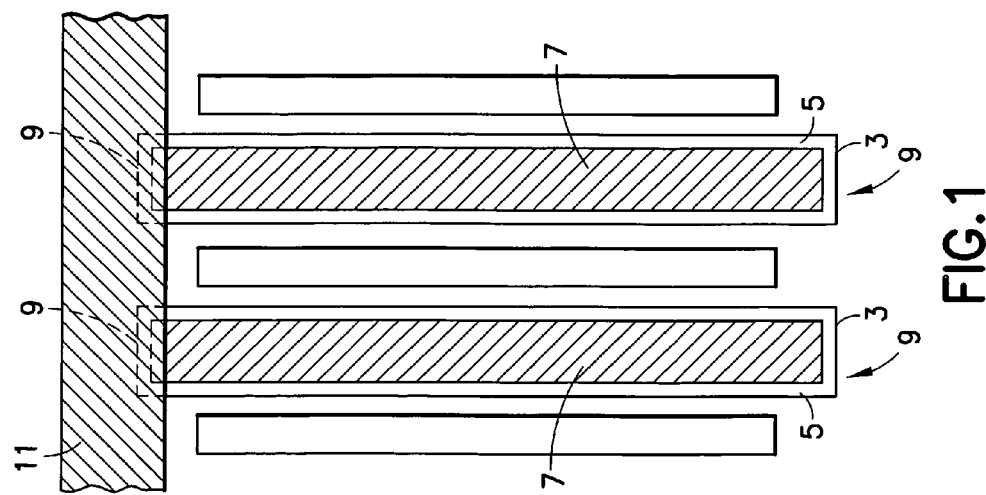

POWER SEMICONDUCTOR DEVICE WITH INTERCONNECTED GATE TRENCHES

RELATED APPLICATION

This application is based on and claims benefit of U.S. Provisional Application No. 60/709,020, filed on Aug. 17, 2005, entitled TRENCH MOSFET PROCESS USING FOUR MASKS, to which a claim of priority is hereby made and the disclosure of which is incorporated by reference, and is a continuation-in-part of U.S. application Ser. No. 11/338,215, filed Jan. 24, 2006, entitled POWER SEMICONDUCTOR DEVICE WITH ENDLESS GATE TRENCHES.

BACKGROUND OF THE INVENTION

Referring to FIG. 1, a power semiconductor device according to the prior art includes a plurality of spaced gate trenches 3, each having a gate insulation 5 body (typically composed of silicon dioxide) lining the sidewalls thereof, and a gate electrode 7 disposed therein. Gate trenches 3 in a prior art device have terminal ends 9. In a known design, a gate bus 11 (which has been rendered transparent for better illustration) is disposed over at least one end 9 of each gate trench 3 in electrical contact with a gate electrode 7 therein.

It is a common commercial practice to rate a power semiconductor device prior to shipping the same to an end user. To perform a voltage breakdown rating, the device is subjected to, for example, a certain screening voltage.

It has been observed that gate insulation 5 at end 9 has been a source of premature breakdown. Therefore, screening voltages have been set low to avoid the premature breakdown during rating and qualification. As a result, it has been difficult to isolate devices with trench defects and the like during the screening and qualification process.

It is, therefore, desirable to reduce or eliminate premature gate insulation breakdown in order to improve the rating and qualification process.

In U.S. application Ser. No. 11/338,215, filed Jan. 24, 2006 and assigned to the assignee of the present application, a power semiconductor device is disclosed which overcomes the problems discussed above. FIGS. 2 and 3 illustrate the device disclosed in U.S. application Ser. No. 11/338,215.

Referring to FIGS. 2 and 3, a power semiconductor device 6 includes drift region 10 of a first conductivity (e.g. N-type), base region 12 of a second conductivity (e.g. P-type) over drift region 10, a plurality of endless trenches 14 extending through base region 12 to drift region 10, a gate insulation layer 16 formed in each endless trench 14 adjacent at least base region 12, and an endless gate electrode 18 residing in each endless trench 14. Each endless trench 14 includes two spaced parallel trenches 14', and two opposing connecting trenches 14" connecting parallel trenches 14'.

Device 6 further includes conductive regions 22 of the first conductivity over body region 12 adjacent each parallel trench 14' of each endless trench 14. Furthermore, a high conductivity region 24 of the second conductivity type but of lower resistivity than body region 12 (e.g. P+) is formed in body region 12 between two opposing conductive regions 22.

Conductive regions 22 are part of what is commonly referred to as an active region. As seen in the FIGS. 2 and 3, each endless trench 14 is spaced from another endless trench 14 by an active region, and includes an active region within an interior region 15 thereof. Furthermore, connecting trenches 14" are curved.

Gate bus 20 (which has been rendered partially transparent for better illustration) is disposed over at least a portion of one connecting trench 14" of each endless trench 14 and electrically connected to gate electrode 18 disposed therein. Furthermore, each endless trench 14 has a curved bottom, and thick insulation body 26 (thicker than gate insulation 16) over the curved bottom. Drift region 10 is an epitaxially formed semiconductor body residing over a substrate 28 of the same semiconductor material and the same conductivity.

Device 6 further includes first power electrode 30 ohmically connected to conductive regions 22 and high conductivity regions 24, and second power electrode 32 electrically connected to substrate 28.

SUMMARY OF THE INVENTION

A power semiconductor device according to the present invention includes a drift region of a first conductivity, a base region of a second conductivity over the drift region, a first plurality of trenches extending through the base region to the drift region, a first perimeter trench disposed around and intersecting the first gate trenches, whereby the gate trenches are interconnected, a gate insulation layer formed in each gate trench adjacent the base region, and a gate electrode residing in each first gate trench.

In a device according to the first embodiment of the present invention the perimeter trench is a termination trench.

In a device according to the second embodiment of the present invention, a termination trench is disposed around the perimeter trench.

A device according to the third embodiment of the present invention further includes a second plurality of gate trenches extending through the base region into the drift region, a second perimeter trench disposed around and intersecting the second gate trenches, whereby the second gate trenches are interconnected, a gate insulation layer formed in each second gate trench adjacent the base region, and a gate electrode residing in each gate trench.

A device according to the present invention may optionally include an equipotential ring (EQR) trench around the termination trench.

According to another aspect of the present invention, a gate bus is disposed over at least a portion of the perimeter trench and electrically connected to gate electrode residing in the perimeter trench through spaced opening in an insulation plug over the gate electrode. Optionally, the gate bus may be extended to a field plate that resides in the termination trench.

Other features and advantages of the present invention will become apparent from the following description of the invention which refers to the accompanying drawings.

BRIEF DESCRIPTION OF THE DRAWINGS

FIG. 1 shows a top plan view of a portion of a power semiconductor device according to the prior art.

FIG. 2 shows a top plan view of a portion of a power semiconductor device related to the devices according to the present invention.

DETAILED DESCRIPTION OF THE PREFERRED EMBODIMENT

Figure 3:
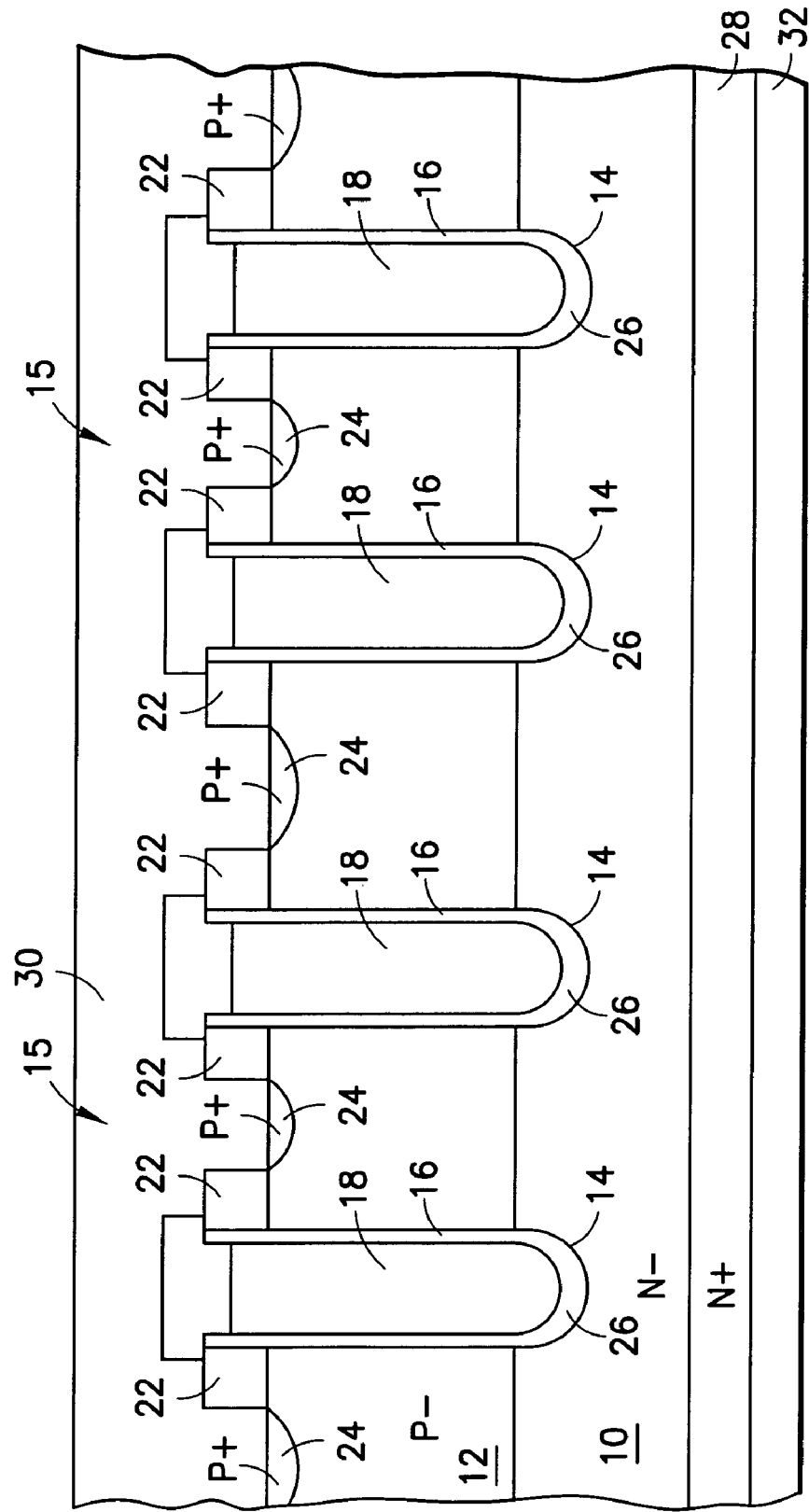
FIG. 3 shows a cross-sectional view of the device of FIG. 2 along line 3-3 in FIG. 2, viewed in the direction of the arrows.
Figure 4:
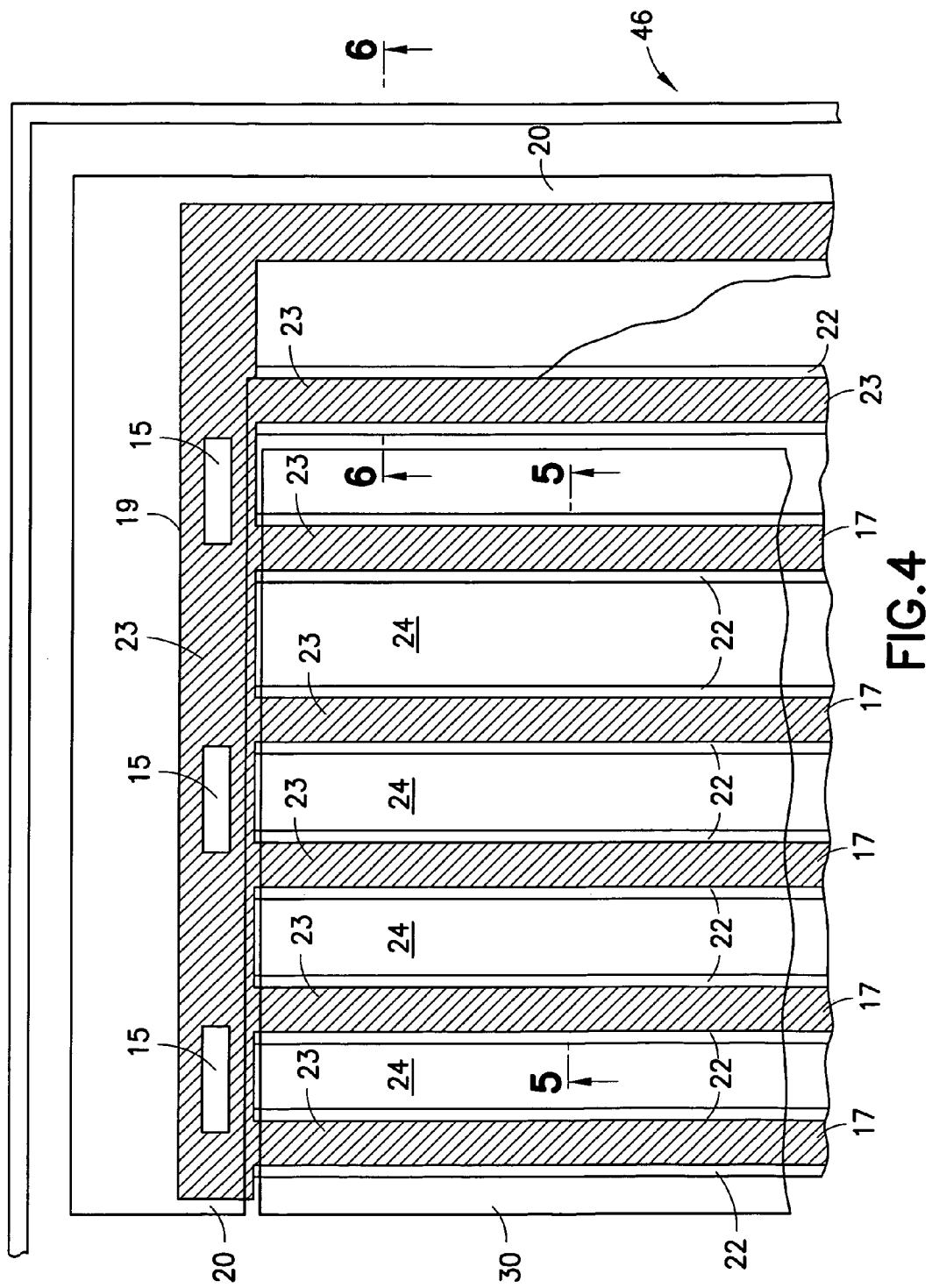
FIG. 4 schematically shows a top plan view of a portion of a device according to the first embodiment.
Figure 5:
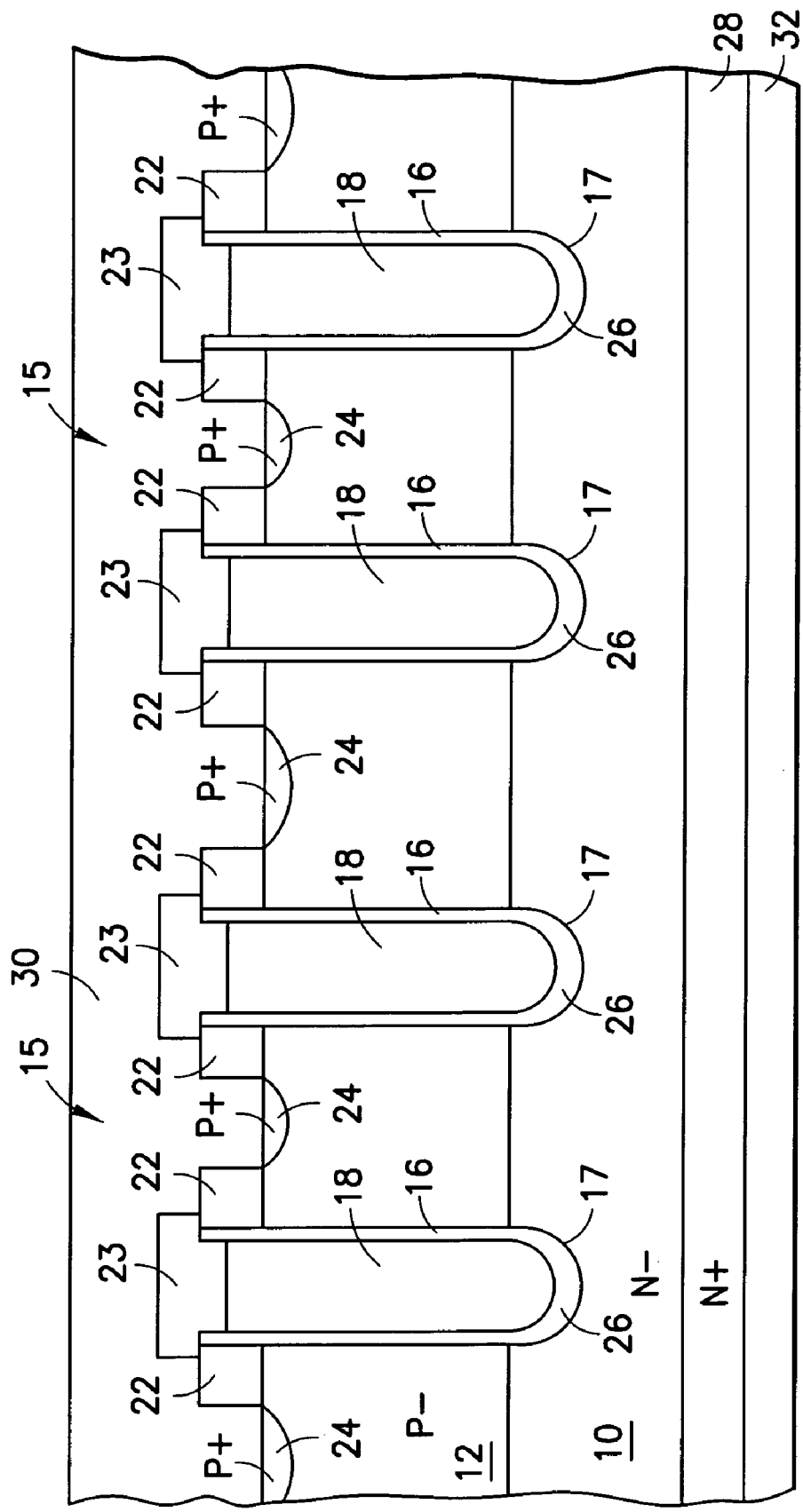
FIG. 5 schematically shows a cross-sectional view of the device of FIG. 4 along line 5-5 in FIGS. 4, 7 and 9 viewed in the direction of the arrows.
Figure 6:
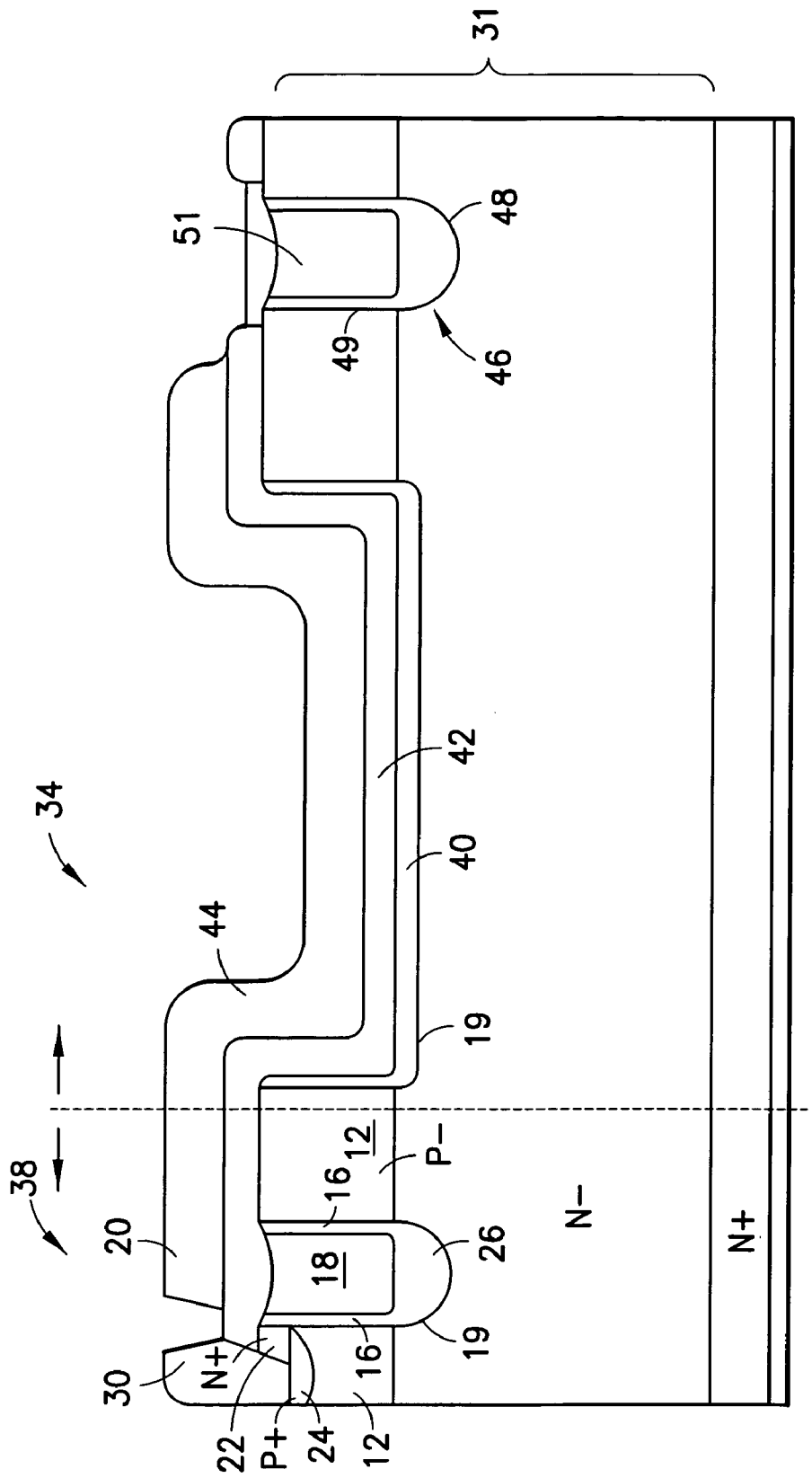
FIG. 6 schematically shows a cross-sectional view of the device of FIG. 4 along line 6-6 in FIG. 4, viewed in the direction of the arrows.

Referring to FIGS. 4, 5, and 6, a power semiconductor device according to the first embodiment includes drift region 10 of a first conductivity (e.g. N-type), base region 12 of a second conductivity (e.g. P-type) over drift region 10, a plurality of stripe-shaped gate trenches 17 extending through base region 12 to drift region 10, a gate insulation layer 16 formed in each gate trench 17 adjacent at least base region 12, and gate electrode 18 residing in each gate trench 17.

According to an aspect of the present invention, a peripheral trench 19 intersects and thus interconnects gate trenches 17. Note that although not shown explicitly peripheral trench 19 is disposed around and surrounds gate trenches 17. Furthermore, although not shown explicitly it should be noted that peripheral trench 19 intersects gate trenches at both ends thereby ensuring that none of gate trenches 17 terminates at a tip similar to a prior art device (see FIG. 1).

In a device according to the first embodiment of the present invention, peripheral trench 19 is also part of the termination region 34 of the device. That is, in termination region 34 peripheral trench 19 is also the termination trench which is disposed around active region 38 and extends to a depth below that of base region 12. Termination region 34 preferably further includes first silicon dioxide body 40 which overlies the bottom surface and the sidewalls of termination trench 36, and second silicon dioxide body 42 overlying first silicon oxide body 40. First silicon dioxide 40 is grown oxide meaning that it is formed by growing silicon dioxide through oxidizing the epitaxially grown silicon body 31, and second silicon dioxide body 42 is formed by depositing a low density silicon dioxide body such as TEOS. Together, first and second silicon dioxide 40, 42 bodies form a field insulation body.

A device according to the first embodiment further includes gate bus 20. An extension from gate bus 20 overlies second silicon dioxide body 42, thereby forming a field plate 44. Preferably, termination region 34 further includes an equipotential ring structure (EQR) 46 disposed around perimeter trench 19. EQR 46 includes EQR trench 48 having silicon dioxide 49 disposed on its sidewalls and bottom, and polysilicon 51 disposed therein.

A device according to the first embodiment of the present invention further includes conductive regions 22 of the first conductivity over body region 12 adjacent each gate trench 17. Furthermore, a high conductivity region 24 of the second conductivity type but of lower resistivity than body region 12 (e.g. P+) is formed in body region 12 between two opposing conductive regions 22.

Conductive regions 22 are part of what is commonly referred to as an active region. As seen in the FIGS. 4, 5, and 6, each trench 17 is spaced from another trench 17 by an active region. Furthermore, an active region may be disposed between perimeter trench 19 and a gate trench 17.

Gate bus 20 (which has been rendered partially transparent for better illustration) is disposed over at least a portion of peripheral trench 19 electrically connected to gate electrode 18 disposed therein. Furthermore, preferably each trench 17, 19 has a curved bottom, and thick insulation body 26 (thicker than gate insulation 16) over the curved bottom. Drift region 10 is an epitaxially formed semiconductor body residing over a substrate 28 of the same semiconductor material and the same conductivity.

A device according to the present invention further includes first power electrode 30 ohmically connected to conductive regions 22 and high conductivity regions 24, and second power electrode 32 electrically connected to substrate 28.

Figure 7:
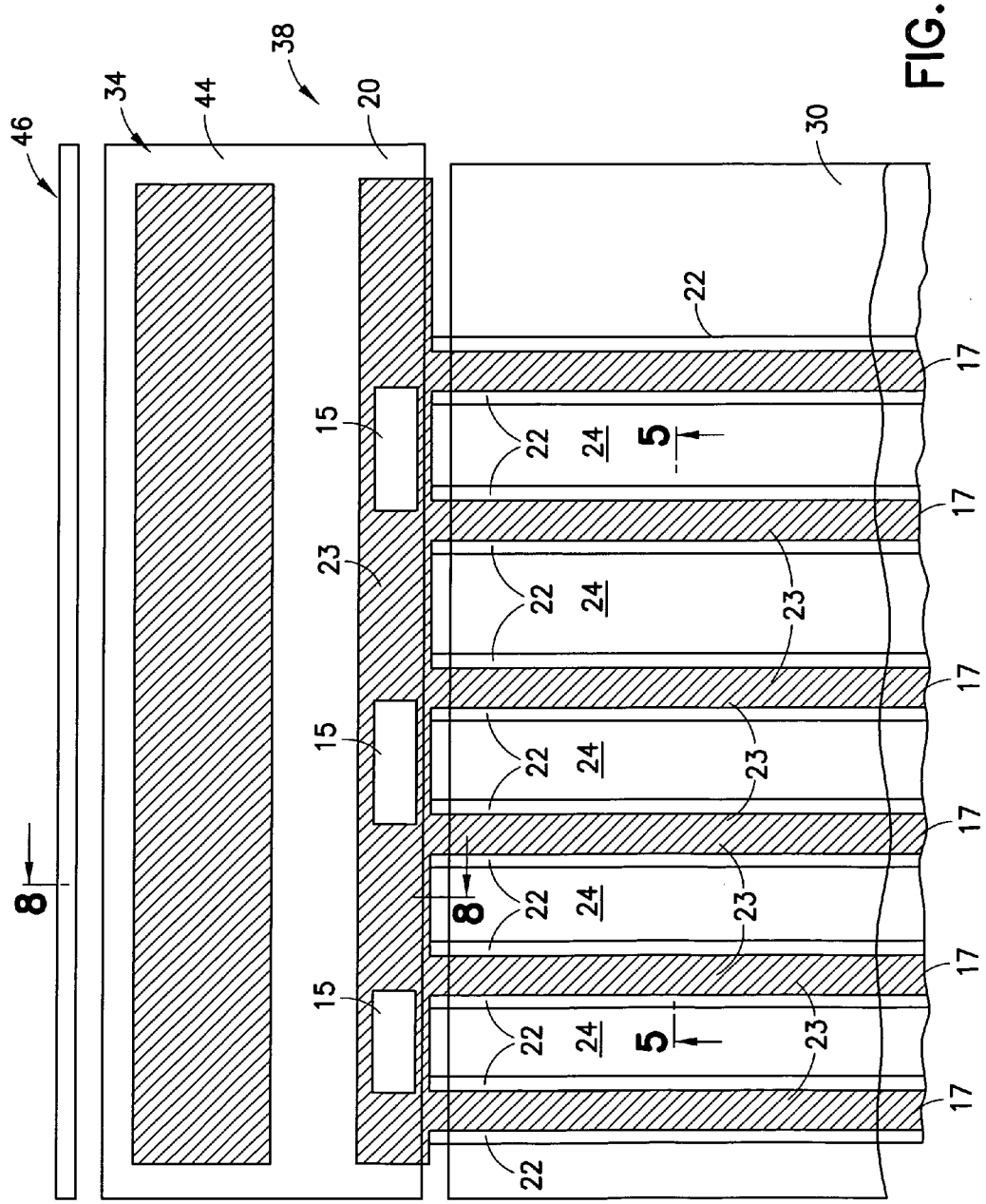
FIG. 7 shows a top plan view of a portion of a device according to the second embodiment of the present invention.
Figure 8:
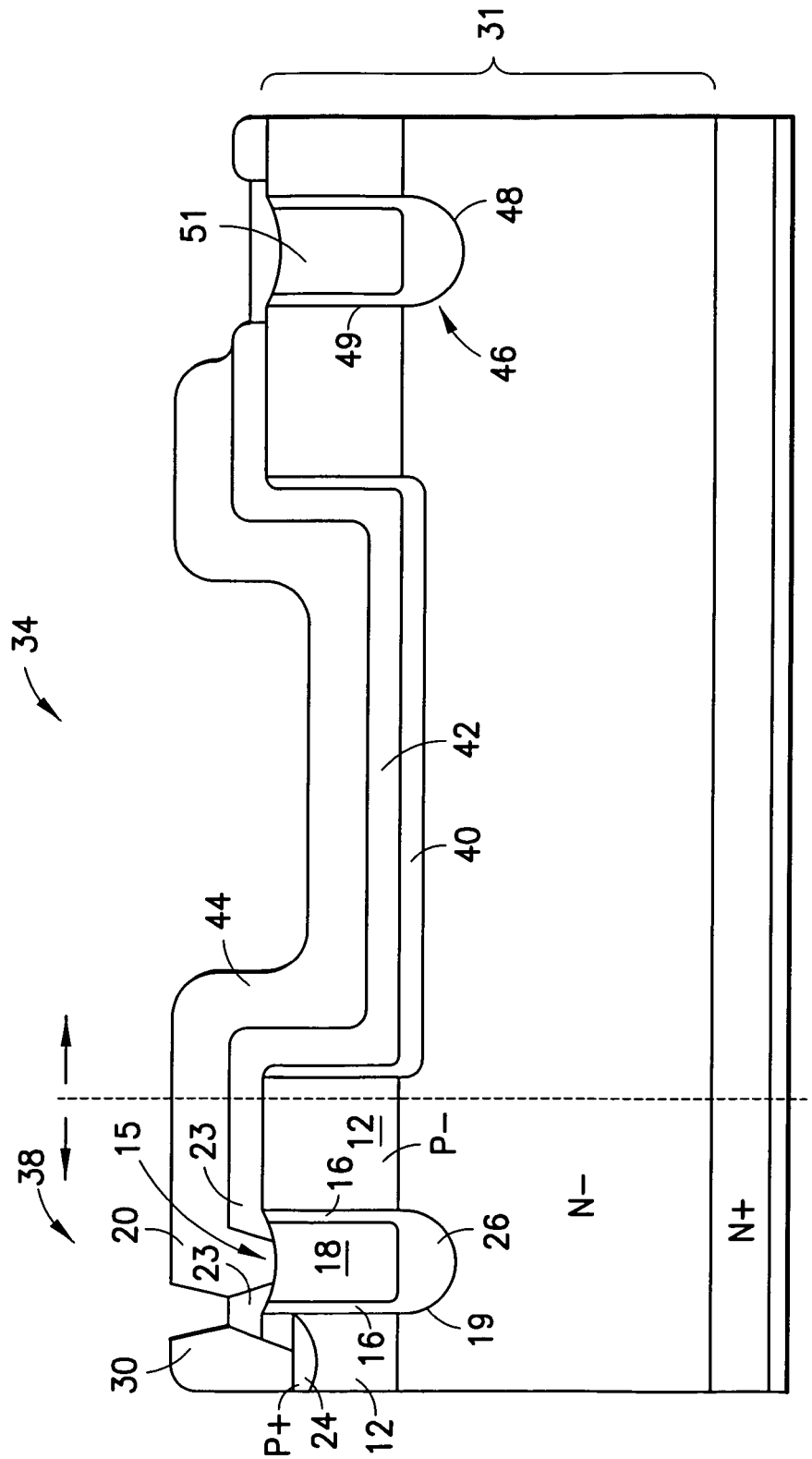
FIG. 8 schematically shows a cross-sectional view of the device of FIG. 7 along line 8-8 in FIG. 7, viewed in the direction of the arrows.

Referring to FIGS. 7 and 8, in which like numerals identify like features, in a device according to the second embodiment of the present invention, perimeter trench 19 is not part of termination region 34. Rather, it is inside active region 38 of the device. Consequently, termination region 34 is disposed around and adjacent active region 38.

Figure 9:
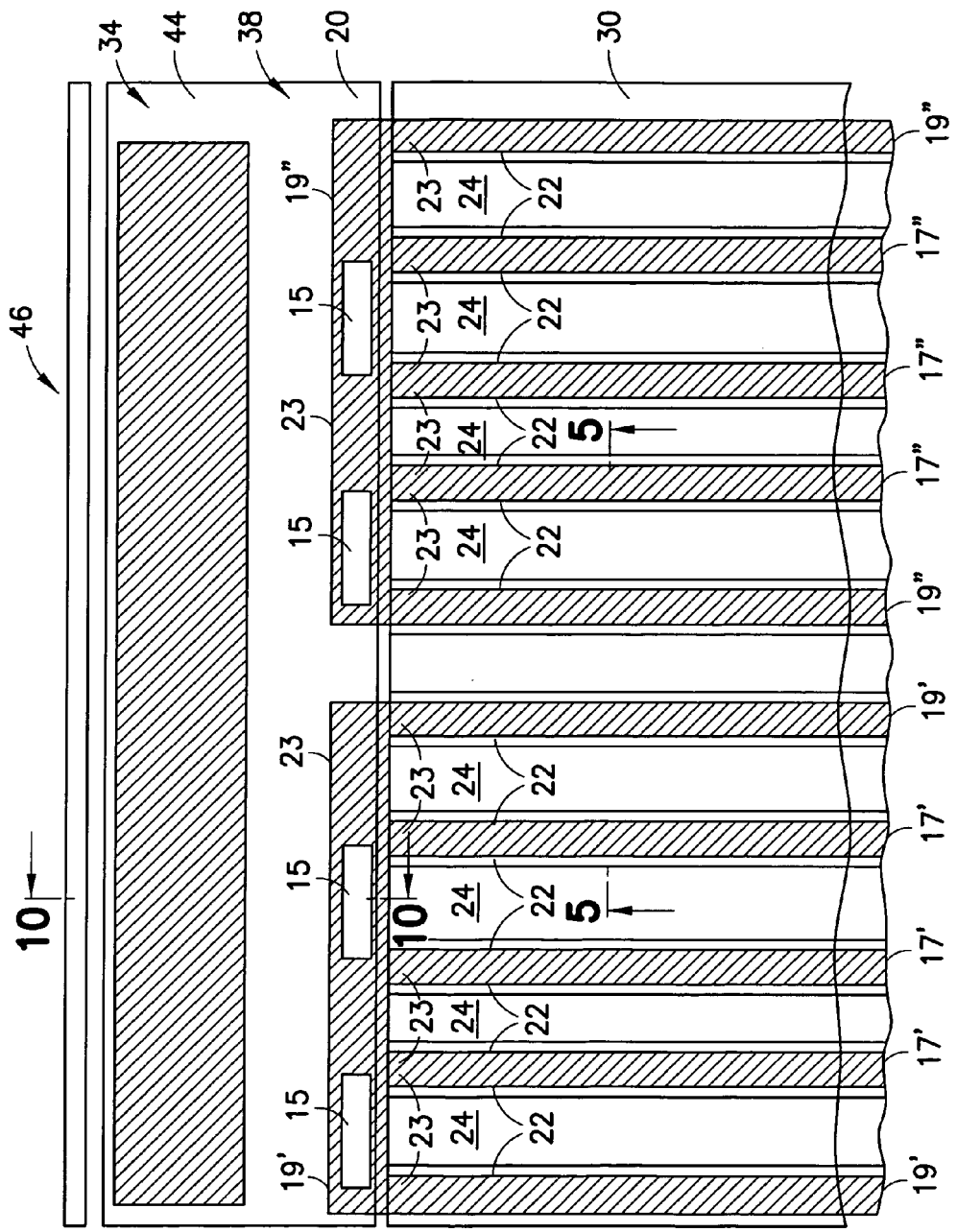
FIG. 9 shows a top plan view of a portion of a device according to the third embodiment of the present invention.
Figure 10:
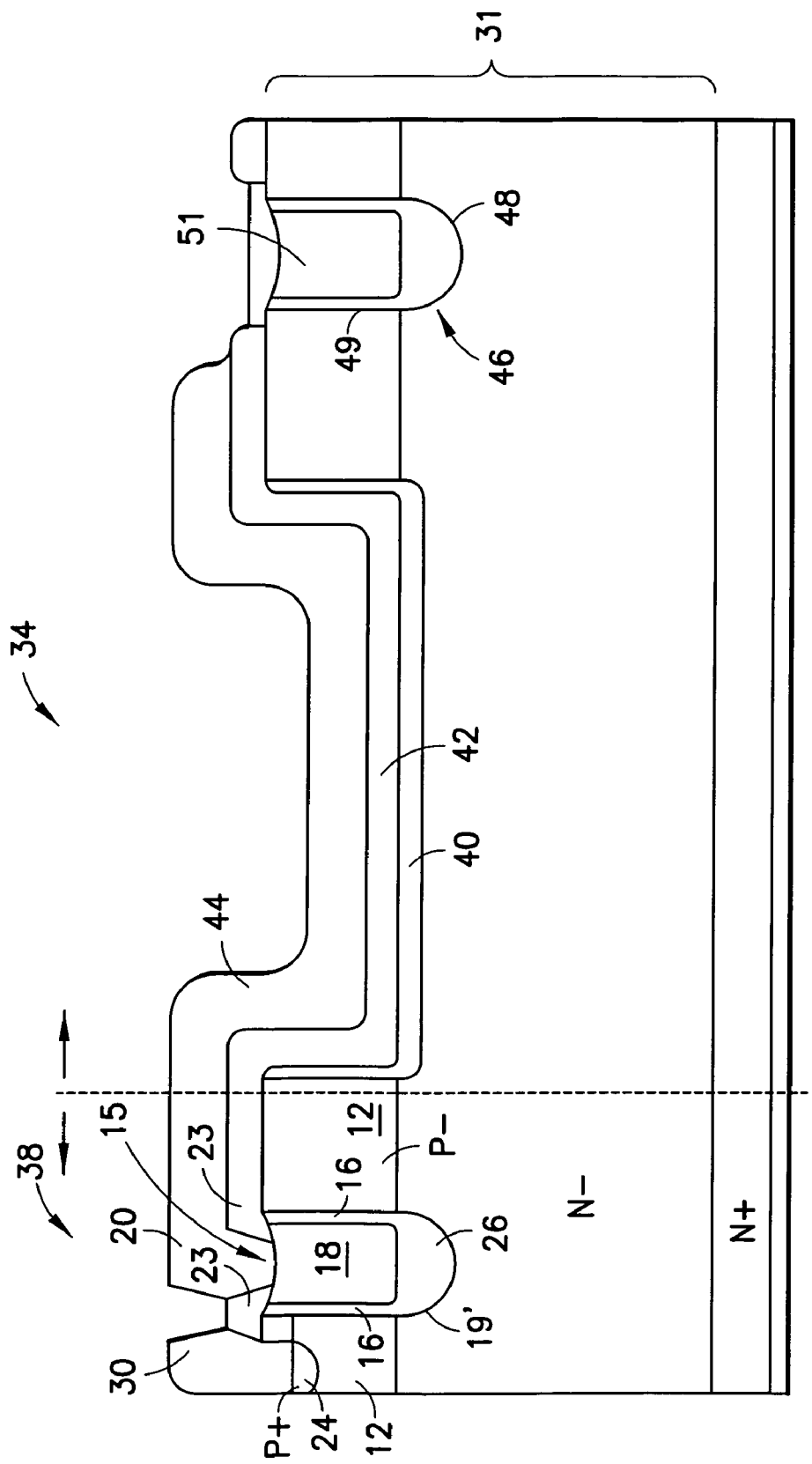
FIG. 10 schematically shows a cross-sectional view of the device of FIG. 9 along line 10-10 in FIG. 9, viewed in the direction of the arrows.

Referring to FIGS. 9 and 10, in which like numerals identify like features, in a device according to the third embodiment of the present invention, two or more sets of gate trenches 17 are provided, and each is interconnected with a respective perimeter trench 19. Thus, a device according to the third embodiment includes a first set of gate trenches 17' intersected and interconnected by peripheral trench 19' and second set of gate trenches 17" intersected and interconnected by peripheral trench 19".

In the second and third embodiments, gate bus 20 is electrically connected to gate electrode 18 residing in perimeter trench 19 through openings 15 in insulation plug 23. A device according to the present invention may be a power MOSFET, in which case, conductive regions 22 are source regions, first power electrode 30 is the source electrode, and second power electrode 32 is the drain electrode. Alternatively, a device according to the present invention may be an IGBT, in which case, conductive regions 22 may be emitter regions, first power electrode 30 may be the emitter electrode and second power electrode may be the collector electrode.

In the preferred embodiment, drift region 10 is an epitaxially formed silicon that is formed over a silicon substrate, gate electrodes 18 are formed with conductive polysilicon, and gate insulation 16 and insulation bodies 26 are formed with silicon dioxide. First and second power electrodes 30, 32 as well as gate bus 20 and field plate 44 may be formed with any suitable metal, for example, aluminum or aluminum silicon.

With the improvement in the breakdown voltage of the gate oxide in a device according to the present invention, it is possible to screen the parts with higher voltages. The higher screening voltages are effective in weeding out devices with defective trenches. As a result the rating and qualification process is enhanced.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:
1. A power semiconductor device comprising:
a drift region of a first conductivity;
a base region of a second conductivity over said drift region;
a plurality of first gate trenches extending through said base region to said drift region;
conductive regions of said first conductivity adjacent said first gate trenches;

a first power electrode electrically coupled to said conductive regions of said first conductivity;

a first perimeter trench disposed around and intersecting said first gate trenches, said first perimeter trench including a first section and a second section, said first section intersecting said first gate trenches and said second section extending along a same direction as said first gate trenches;

a gate insulation layer formed in each first gate trench adjacent said base region;

a gate electrode residing in each first gate trench and said first perimeter trench; and a gate bus disposed at least over a portion of said perimeter trench and electrically connected to said gate electrode in said perimeter trench, said gate bus surrounding at least a portion of said power electrode by including first and second integrally formed portions, said first portion extending along said first section and a second portion extending along said same direction as said first gate trenches, wherein said power electrode includes one edge opposite and spaced from said first portion of said gate bus and another edge opposite and spaced from said second portion of said gate bus.

2. The power semiconductor device of claim 1, wherein said perimeter trench is a termination trench.

3. The power semiconductor device of claim 1, further comprising a termination trench disposed around said perimeter trench.

4. The power semiconductor device of claim 3, further comprising an EQR trench around said termination trench.

5. The power semiconductor device of claim 1, wherein said gate electrode is comprised of conductive polysilicon.

6. The power semiconductor device of claim 1, wherein said gate insulation layer is comprised of silicon dioxide.

7. The power semiconductor device of claim 1, wherein each said gate trench includes a curved bottom portion.

8. The power semiconductor device of claim 1, further comprising an insulation body disposed at the bottom of each first gate trench, said insulation body being thicker than said gate insulation layer.

9. The power semiconductor device of claim 1, wherein said drift region is disposed over a substrate.

10. The power semiconductor device of claim 9, wherein said substrate is comprised of silicon.

11. The power semiconductor device of claim 1, wherein said power semiconductor device is a MOSFET.

12. The power semiconductor device of claim 1, wherein said power semiconductor device is an IGBT.

13. The power semiconductor device of claim 1, further comprising a plurality of second gate trenches extending through said base region into said drift region;

a second perimeter trench disposed around and intersecting said second gate trenches;

a second gate insulation layer formed in each second gate trench adjacent said base region; and a second gate electrode residing in each second gate trench.

14. The power semiconductor device of claim 1, wherein said gate bus extends into and forms a field plate in a termination region of said device.

15. The power semiconductor device of claim 1, wherein said termination region includes a termination trench and said gate bus extends into and forms a field plate inside said termination trench.

16. The power semiconductor device of claim 15, comprising a field insulation body overlying the bottom surface and the sidewalls of said termination trench, said field insulation body having a thickness greater than that of said gate insulation layer.

17. The power semiconductor device of claim 15, comprising a field insulation body overlying the bottom surface and the sidewalls of said termination trench, said field insulation body comprising a first silicon dioxide body and a second silicon dioxide body overlying said first silicon oxide body.

18. The power semiconductor device of claim 17, wherein said second silicon dioxide body extends out of said termination trench underneath said gate bus.

19. The power semiconductor device of claim 1, wherein said gate bus completely surrounds said power electrode.

* * * * *